United States Patent
Chen et al.

(10) Patent No.: US 8,146,032 B2
(45) Date of Patent: Mar. 27, 2012

(54) METHOD AND APPARATUS FOR PERFORMING RLC MODELING AND EXTRACTION FOR THREE-DIMENSIONAL INTEGRATED CIRCUIT (3D-IC) DESIGNS

(75) Inventors: Qiushi Chen, San Jose, CA (US);
Beifang Qiu, Sunnyvale, CA (US);
Charles C. Chiang, Saratoga, CA (US);
Xiaoping Hu, Sunnyvale, CA (US);
Mathew Koshy, San Mateo, CA (US);
Baribrata Biswas, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 471 days.

(21) Appl. No.: 12/363,485

(22) Filed: Jan. 30, 2009

(65) Prior Publication Data

US 2010/0199236 A1    Aug. 5, 2010

(51) Int. Cl.
*G06F 17/50* (2006.01)
*G06F 9/455* (2006.01)

(52) U.S. Cl. .......... 716/106; 716/51; 716/101; 716/107; 716/111; 716/132; 716/136; 716/137; 716/138; 716/139

(58) Field of Classification Search ............. 716/51, 716/101, 106, 107, 111, 132, 136, 137, 138, 716/139
See application file for complete search history.

(56) References Cited

U.S. PATENT DOCUMENTS

| | | | |
|---|---|---|---|
| 5,109,479 A | 4/1992 | Williams | |
| 5,903,469 A * | 5/1999 | Ho | 716/115 |
| 6,175,947 B1 * | 1/2001 | Ponnapalli et al. | 716/115 |
| 6,438,729 B1 * | 8/2002 | Ho | 716/113 |
| 6,467,069 B2 * | 10/2002 | Mehrotra et al. | 716/113 |
| 6,992,919 B2 | 1/2006 | Andrei | |
| 7,260,810 B2 | 8/2007 | Filippi, Jr. | |
| 7,783,999 B2 * | 8/2010 | Ou et al. | 716/136 |
| 7,786,436 B1 * | 8/2010 | Lundquist et al. | 250/309 |
| 8,019,580 B1 * | 9/2011 | Chandra et al. | 703/6 |
| 8,048,794 B2 * | 11/2011 | Knickerbocker | 438/618 |
| 2008/0244489 A1 | 10/2008 | Tanamoto | |
| 2009/0193370 A1 * | 7/2009 | Bantas et al. | 716/4 |
| 2009/0254873 A1 * | 10/2009 | Uriu et al. | 716/5 |

(Continued)

OTHER PUBLICATIONS

Pathak et al.; "Performance and Thermal-Aware Steiner Routing for 3-D Stacked ICs"; Publication Year: 2009; Computer-Aided Design of Integrated Circuits and Systems, IEEE Transactions on; vol. 28 , Issue: 9; pp. 1373-1386.*

(Continued)

*Primary Examiner* — Helen Rossoshek
(74) *Attorney, Agent, or Firm* — Park, Vaughan, Fleming & Dowler LLP

(57) ABSTRACT

One embodiment of the present invention provides a system that performs an RLC extraction for a three-dimensional integrated circuit (3D-IC) die. During operation, the system receives a 3D-IC die description. The system then transforms the 3D-IC die description into a set of 2D-IC die descriptions, wherein the transform maintains equivalency between the set of 2D-IC die descriptions and the 3D-IC die description. Next, for each 2D-IC die description in the set of 2D-IC die descriptions, the system performs an electrical property extraction using a 2D-IC extraction tool to obtain a 2D-IC RLC netlist file. The system then combines the set of 2D-IC RLC netlist files for the set of 2D-IC die descriptions to form an RLC netlist file for the 3D-IC die description.

29 Claims, 9 Drawing Sheets

U.S. PATENT DOCUMENTS

2011/0185323 A1* 7/2011 Hogan et al. .................. 716/52

OTHER PUBLICATIONS

Pavlidis et al.; "Interconnect-Based Design Methodologies for Three-Dimensional Integrated Circuits"; Publication Year: 2009; Proceedings of the IEEE; vol. 97, Issue: 1; pp. 123-140.*

Liu et al.; "Mapping system-on-chip designs from 2-D to 3-D ICs"; Publication Year: 2005; Circuits and Systems, 2005. ISCAS 2005. IEEE International Symposium on; pp. 2939-2942 vol. 3.*

Kim et al.; "Crosstalk reduction in mixed-signal 3-D integrated circuits with interdevice layer ground planes"; Publication Year: 2005; Electron Devices, IEEE Transactions on; vol. 52, Issue: 7; pp. 1459-1467.*

Cheng et al.; "Floorplanning for 3-D VLSI design"; Publication Year: 2005; Design Automation Conference, 2005. Proceedings of the ASP-DAC 2005. Asia and South Pacific; vol. 1; pp. 405-411 vol. 1.*

Bauer et al.; "3D device integration"; Publication Year: 2009; Electronics Packaging Technology Conference, 2009. EPTC '09. 11th; pp. 427-430.*

Healy et al.; "Multiobjective Microarchitectural Floorplanning for 2-D and 3-D ICs"; Publication Year: 2007; Computer-Aided Design of Integrated Circuits and Systems, IEEE Transactions on; vol. 26, Issue: 1; pp. 38-52.*

* cited by examiner

METHOD AND APPARATUS FOR PERFORMING RLC MODELING AND EXTRACTION FOR THREE-DIMENSIONAL INTEGRATED CIRCUIT (3D-IC) DESIGNS

BACKGROUND

1. Field

Embodiments of the present invention generally relate to techniques for designing and manufacturing integrated circuits (ICs). More specifically, embodiments of the present invention relate to a technique for RLC modeling and extraction for three-dimensional integrated circuit (3D-IC) designs.

2. Related Art

Dramatic improvements in circuit design and manufacturing technology have made it possible to integrate hundreds of millions of transistors onto a single integrated circuit (IC) chip. More specifically, these improvements in IC integration densities have been achieved by shrinking IC feature sizes horizontally according to Moore's law. Because the scaling is performed horizontally, the IC chips are two-dimensional (2D) in nature (referred to as "2D-ICs") and are coupled to other 2D-IC chips or packages through I/O pins.

As process scaling approaches the nanometer regime, improving performance through such horizontal scaling is becoming increasingly difficult because the IC feature sizes are approaching physical limits which results in large power consumption, manufacturing complexity, etc. Hence, the semiconductor industry is considering new technologies to continue to increase the integration densities.

Three-dimensional (3D)-IC technology is one such emerging technology that enables chip size reductions in the vertical direction by vertically stacking multiple IC dies. Two types of 3D-IC techniques have been proposed: package-level integration and wafer-level integration. Package-level integration techniques often suffer from limitations such as reduced interconnect density. On the other hand, wafer-level integration techniques, which use through-silicon vias (TSVs) or silicon interposers, can enable vertical IC-die integration and scaling without using external packaging connections. Such 3D-ICs are often vertically integrated through thinned silicon substrates and TSVs, and often require bonding techniques between vertically stacked dies.

Unfortunately, conventional electronic design automation (EDA) tools have been designed to work with 2D-ICs. As a result, conventional EDA tools usually cannot be used with 3D-ICs.

Hence, there is a need for EDA tools that can be used for designing 3D-ICs.

SUMMARY

One embodiment of the present invention provides a system that performs an RLC extraction for a three-dimensional integrated circuit (3D-IC) die. During operation, the system receives a 3D-IC die description. The system then transforms the 3D-IC die description into a set of 2D-IC die descriptions, wherein the transform maintains equivalency between the set of 2D-IC die descriptions and the 3D-IC die description. Next, for each 2D-IC die description in the set of 2D-IC die descriptions, the system performs an electrical property extraction using a 2D-IC extraction tool to obtain a 2D-IC RLC netlist file. The system then combines the set of 2D-IC RLC netlist files for the set of 2D-IC die descriptions to form an RLC netlist file for the 3D-IC die description.

In some embodiments, the 3D-IC die description comprises a through-silicon via (TSV) die. The TSV die includes a front-side layer stack which includes: a top metal layer; a back-side layer stack which includes at least one back-side metal layer; a double-sided substrate which is disposed between the front-side layer stack and the back-side layer stack; and a TSV which passes through the double-sided substrate, and which electrically couples the front-side layer stack with the back-side layer stack.

In some embodiments, the system transforms the TSV die into one or more 2D-IC die descriptions.

In some embodiments, the system transforms the TSV die into one or more 2D-IC die descriptions by projecting the back-side layer stack onto the top of the front-side layer stack of the TSV die to create a virtual front-side layer stack. The system subsequently removes the back-side layer stack, thereby transforming the double-sided substrate into a single-sided substrate. The system then couples the TSV to the virtual front-side layer stack while decoupling the TSV from the single-sided substrate, thereby transforming the TSV die into a 2D-IC die description.

In some embodiments, the system maintains equivalency between the TSV die and the 2D-IC die description by creating a virtual substrate shield layer which is a conductor layer disposed between the virtual front-side layer stack and the top metal layer of the front-side layer stack, wherein the TSV passes through the virtual substrate shield layer.

In some embodiments, the virtual substrate shield layer is invisible to the front-side layer stack.

In some embodiments, the 3D-IC die description includes a die stack, wherein the die stack further includes: a first die; a second die adjacent to the first die; and a TSV interconnecting the first die and the second die.

In some embodiments, the system transforms the die stack into at least two separate dies.

In some embodiments, the system transforms the die stack into at least two separate dies by first identifying a transform boundary between the first die and the second die, and then separating the first die from the second die to create a first transformed die and a second transformed die, respectively. Note that the first transformed die includes the first die and at least one metal layer adjacent to the transform boundary in the second die. The second transformed die includes the second die and at least one metal layer adjacent to the transform boundary in the first die. By including at least one metal layer from an adjacent die, the system facilitates maintaining equivalency between the two transformed dies and the die stack.

In some embodiments, the transform boundary can be: (1) an interface between a top metal layer in the first die and a top metal layer in the second die in a face-to-face configuration of the 3D-IC die description; (2) an interface between a back-side metal layer in the first die and a top metal layer in the second die in a face-to-back configuration of the 3D-IC die description; or (3) an interface between a back-side metal layer in the first die and a back-side metal layer in the second die in a back-to-back configuration of the 3D-IC die description.

In some embodiments, the first die is a TSV die.

In some embodiments, the system further transforms each of the transformed dies into one or more 2D-IC die descriptions.

In some embodiments, the equivalency between the set of 2D-IC die descriptions and the 3D-IC die description can include an electrical property equivalency and a connectivity equivalency.

In some embodiments, a TSV die can be a silicon-interposer die.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Integrated Circuit Design Flow

Figure 1:
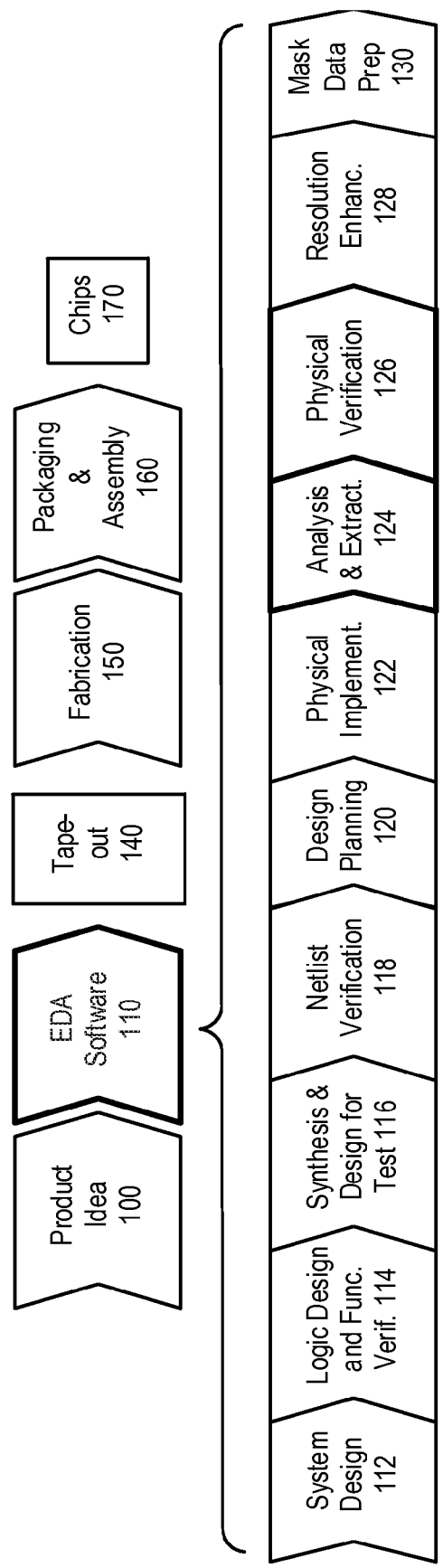
FIG. 1 illustrates various stages in the design and fabrication of an integrated circuit.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIME®, HSPICE®, HSIM®, NANOTIME®, NANOSIM® and STAR-RCXT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement (stage 128): This stage involves geometric manipulations of the layout to improve manufacturability of the design. Exemplary EDA software products from SYNOPSYS, INC. that can be used at this stage include PROTEUS®, PROTEUS®AF, and PSMGED® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the analysis and extraction step 124 and physical verification step 126.

RLC Extraction for a 2D-IC Design

An RLC extraction process for a 2D-IC design often starts by building RLC model libraries for a single specific process technology description associated with the 2D-IC. The RLC extraction process then extracts the design layout database files (which can be in the form of GDSII, LEF, or DEF files, or Milkyway®, among others), and then outputs the RLC netlist file and parasitic files (which can be in the form of DSPF or SPEF files, among others) to be used in electrical simulations and analysis.

A 2D-IC RLC extraction tool often makes the following assumptions:

Single-sided substrate: silicon substrate is always at the bottom of the die and the metal/active layer stacks are only on one side of the substrate;

There is no need for modeling and extracting inter-die RLCs;

There is no need for modeling and extracting through-silicon vias (TSVs); and

RLC parasitic output files are based on individual dies.

In the following discussion, the terms "RLC extraction" and "parasitic extraction" are used interchangeably to mean electrical property extraction from an IC die. Such electrical property can include, but is not limited to resistance (R), inductance (L), and capacitance (C).

Overview

Note that during an IC design process, on-chip RLC extraction is essential because it transforms layout data into electrical parameters for electrical simulations and verifications of the design, regardless of whether the IC design is a 2D-IC design or a 3D-IC design. Furthermore, the inter-die RLC properties of a heterogeneous 3D-IC cannot be modeled by 2D-IC extraction tools because such 3D-IC designs involve more than one process technology description.

Some embodiments of the present invention provide a technique for performing RLC extractions on a 3D-IC design, such as a 3D-IC die stack. More specifically, the present technique can transform a 3D-IC design, which can include two or more vertically stacked dies and one or more TSVs, into a set of 2D-IC dies, wherein each 2D-IC die is extractable using 2D-IC extraction tools. Moreover, the transform from the 3D-IC design to the set of 2D-IC dies preserves electrical and connectivity equivalency between the set of 2D-IC dies and the 3D-IC design, thereby ensuring accuracy in subsequent RLC extraction. Next, each 2D-IC die can be extracted using conventional 2D-IC extraction tools to generate a separate RLC netlist file, hence generating a set of RLC netlist files for the set of 2D-IC dies. In the following discussion, each 2D-IC die decomposed from a 3D-IC design is also referred to as "an extraction unit" because it can be extracted using 2D-IC extraction tools. Finally, the set of RLC netlist files can be combined into a single RLC netlist output file for the 3D-IC design, wherein the single RLC netlist output file maintains the same electric net and node connectivity as in the 3D-IC design.

A 3D-IC Structure

Figure 2:
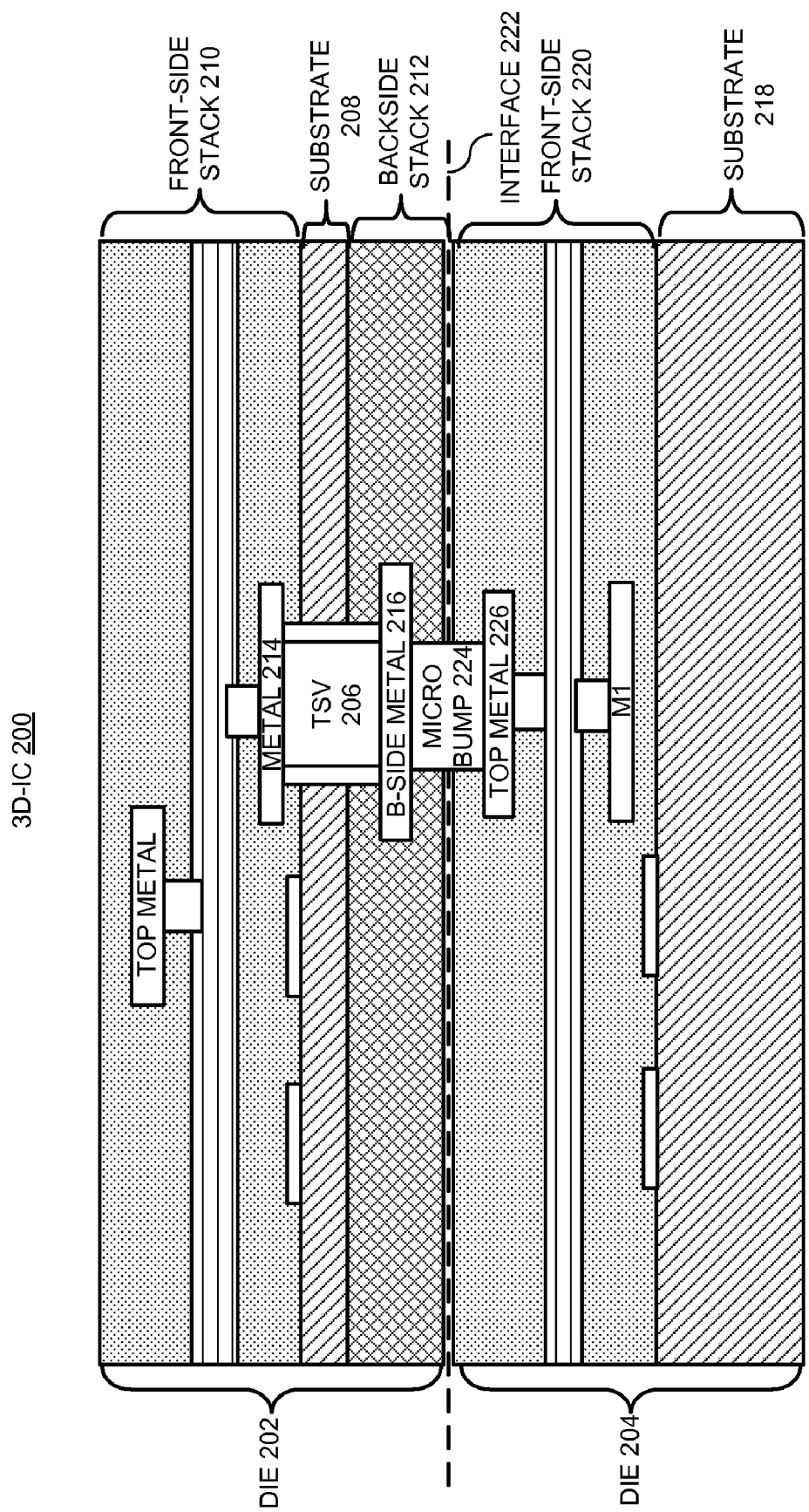
FIG. 2 illustrates a 3D-IC comprised of two vertically stacked dies which are interconnected through a through-silicon via (TSV) in accordance with an embodiment of the present invention.

FIG. 2 illustrates a 3D-IC 200 comprised of two vertically stacked dies 202 and 204 which are interconnected through a TSV 206 in accordance with an embodiment of the present invention.

More specifically, upper die 202 of 3D-IC 200 includes a thinned substrate 208 which is sandwiched between a front-side layer stack 210 (hereinafter "front-side stack 210") and a back-side layer stack 212 (hereinafter "back-side stack 212"). Both front-side stack 210 and back-side stack 212 can include one or more active layers and one or more metal layers. Front-side stack 210 and back-side stack 212 are electrically coupled through TSV 206, which interconnects metal layer 214 in front-side stack 210 with a back-side metal layer 216 inside back-side stack 212. In one embodiment, metal layer 214 is the M1 layer in front-side stack 210. Note that TSV 206 can also interconnect front-side stack 210 and back-side stack 212 through metal layers other than metal layer 214 and metal layer 216. Hence, upper die 202 does not have a conventional 2D-IC die. We refer to upper die 202 as having a "double-sided substrate" structure. We also refer to upper die 202 as a "TSV die" because of TSV 206.

Separately, lower die 204 has a single-sided substrate structure including a substrate 218 and a front-side stack 220. Upper die 202 and lower die 204 are vertically stacked in a back-to-face configuration such that back-side stack 212 of upper die 202 directly faces front-side stack 220 of lower die 204 to form an inter-die interface 222. Furthermore, front-side stack 210 of upper die 202 is electrically coupled to front-side stack 220 of lower die 204 through TSV 206 and a micro-bump 224 which is disposed across inter-die interface 222. As shown, micro bump 224 electrically couples and mechanically bonds die 202 and die 204 by interconnecting back-side metal layer 216 of die 202 and top metal layer 226 of die 204. Although only one micro bump is shown interconnecting die 202 and die 204, other embodiments of the present invention can have more than one micro bumps, or other types of bonding techniques for electrically and mechanically coupling die 202 and die 204. These bonding techniques can include, but are not limited to, bump bonding, direct fusion bonding, polymer adhesive bonding, and eutectic bonding. Note that in 3D-IC 200, TSV 206, back-side metal layer 216, and micro bump 224 all contribute to parasitics in 3D-IC 200.

Figure 3A:
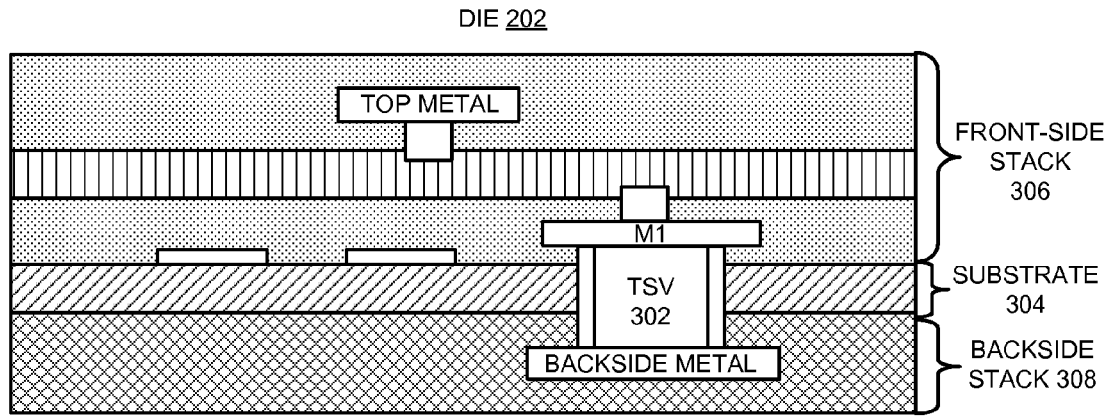
FIG. 3A illustrates the upper die in the 3D-IC decoupled from the lower die in accordance with an embodiment of the present invention.

FIG. 3A illustrates upper die 202 in 3D-IC 200 decoupled from lower die 204 in accordance with an embodiment of the present invention. Die 202 may be referred to as a TSV die because it includes TSV 302 which passes through substrate 304 to electrically couple front-side stack 306 and back-side stack 308 of die 202. Note that conventional 2D-IC extraction tools are not designed to perform parasitic extraction of die 202 because of the double-sided substrate structure and the TSV structure.

Transforming a 3D-IC Die Stack into Extraction Units

In some embodiments of the present invention, prior to performing RLC extraction, a 3D-IC design is transformed into a set of 2D-IC extraction units, which can be extracted using 2D-IC extraction tools. In these embodiments, transforming a 3D-IC design into 2D-IC extraction units involves at least two types of transforms: a die-to-die interface transform and a substrate transform.

More specifically, a die-to-die interface transform can decompose a 3D-IC die stack, such as 3D-IC 200 in FIG. 2, into individual extraction units based on the inter-die stacking interfaces, such as interface 222. Note that a die-to-die interface can serve as a natural transform boundary because of the potential use of heterogeneous process technologies and different design databases on the opposite side of the die-to-die interface. This transform is applicable to different die-stacking configurations, which can include, but are not limited to: face-to-face stacking, face-to-back stacking (as in FIG. 2), back-to-back stacking, and silicon-interposer-based die stacking.

A substrate transform can transform a TSV die into a single-sided substrate structure by performing a back-side projection to the front-side operation. The transformed TSV die becomes an extraction unit. Alternatively, a substrate transform can decompose a TSV die into a front-side extraction unit and a back-side extraction unit based on the common substrate. In this embodiment, a back-side to front-side projection is not required. Note that both the projection-based transformation and the decomposition-based transformation transform the original TSV die into one or more 2D-IC extraction units that only have metal layers on one side of the substrate. Note that a silicon substrate can serve as an ideal transform boundary because a silicon substrate provides shielding effects on inductance and capacitance between the two sides of the substrate.

While the aforementioned transforms transform a 3D-IC design into multiple extraction units, these transforms can introduce RLC equivalency variation between the transformed structures and the original 3D-IC designs. Hence, it is necessary to ensure that the RLC equivalency is maintained through such transforms.

We now describe in more detail different transforms that can be applied to a 3D-IC design to model the 3D-IC design using extractable 2D-IC designs.

Substrate Transform

Figure 3B:
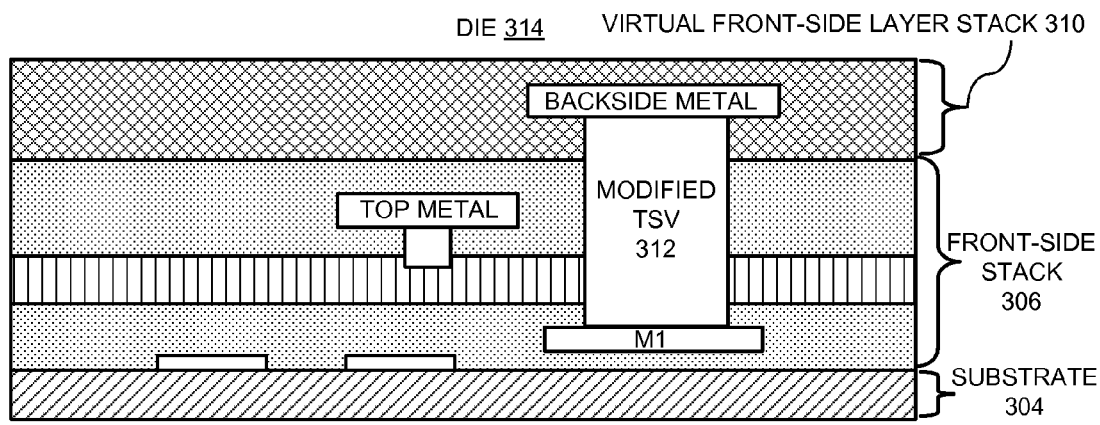
FIG. 3B illustrates a projection-based substrate transform on the TSV die of FIG. 3A in accordance with an embodiment of the present invention.

FIG. 3B illustrates a projection-based substrate transform on TSV die 202 of FIG. 3A in accordance with an embodiment of the present invention.

As illustrated in FIG. 3B, the back-side stack 308 in TSV die 202 is virtually projected to the top of front-side stack 306 of TSV die 202 to create a virtual front-side (layer) stack 310, thereby removing back-side layer 308. Furthermore, TSV 302 is modified by coupling TSV 302 to virtual front-side stack 310 while decoupling TSV 302 from the substrate, thereby creating modified TSV 312. This TSV modification preserves the connectivity information between virtual front-side stack 310 and front-side stack 306. As a result, the double-sided substrate structure in die 202 is transformed into a single-sided substrate structure, and TSV 302 is transformed into a conventional via which does not go through the substrate. As a result, the transformed TSV die 314 in FIG. 3B becomes extractable as a 2D-IC die.

Note that transformed TSV die 314 does not preserve the electrical equivalency in the original TSV die 202 because the physical distances between the metal layers in back-side stack 308 and substrate 304 are generally less than the physical distances between the metal layers in the virtual front-side stack 310 and substrate 304. In addition, original back-side stack 308 in FIG. 3A does not have coupling capacitances and mutual inductances with front-side stack 306 due to the physical presence of substrate 304 which acts as an electrical shield between the front and back-side layer stacks, whereas the projected virtual front-side layers 310 may have coupling capacitances and mutual inductances with front-side stack 306.

Figure 3C:
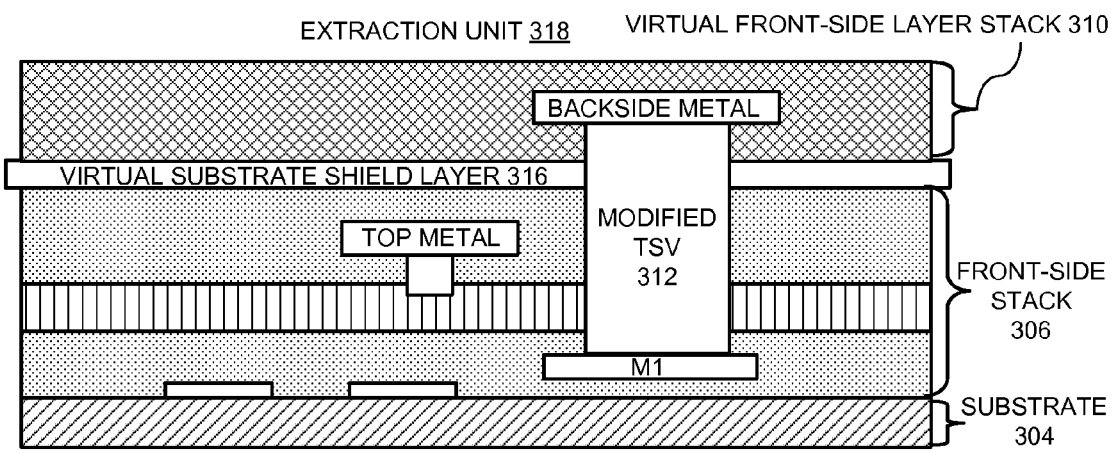
FIG. 3C illustrates a technique for maintaining transform equivalency on a transformed TSV die by using a virtual ground shield in accordance with an embodiment of the present invention.

FIG. 3C illustrates a technique for maintaining transform equivalency on a transformed TSV die by using a virtual ground shield in accordance with an embodiment of the present invention.

As illustrated in FIG. 3C, a virtual substrate shield layer 316 is created within the transformed TSV die 314, wherein virtual substrate shield layer 316 can be a conductor layer. More specifically, virtual substrate shield layer 316 is disposed between virtual front-side stack 310 and the original front-side stack 306, wherein the modified TSV 312 passes through virtual substrate shield layer 316. In some embodiments, the distances between metal layers in virtual front-side stack 310 and virtual substrate shield layer 316 are substantially equal to the distances between metal layers in the original back-side stack 308 and substrate 304. Consequently, the parasitic capacitances and mutual inductances between the original back-side metal layers and substrate 304 are equivalently transformed to the front-side of die 314. Furthermore, virtual substrate shield layer 316 becomes "invisible" to front-side stack 306 which emulates the shielding effects of substrate 304 in die 202. Hence, no coupling capacitances and mutual inductances are created between the front-side metal layers and the virtual front-side metal layers. Consequently, TSV die 202 is equivalently transformed into a single extraction unit 318.

In one embodiment of the present invention, both front-side stack 306 and back-side stack 308 (and thus virtual front-side stack 310) have corresponding preexisting RLC models. Hence, a composite RLC model library for extraction unit 318 can be built by combining the two RLC models. This composite RLC model library may subsequently be used during RLC extraction for extraction unit 318. Note that during subsequent extraction of the composite RLC model library, the extraction tool does not distinguish if a layer is a front-side layer or a back-side layer in the original TSV die.

Direct TSV-Die Transform

Figure 3D:
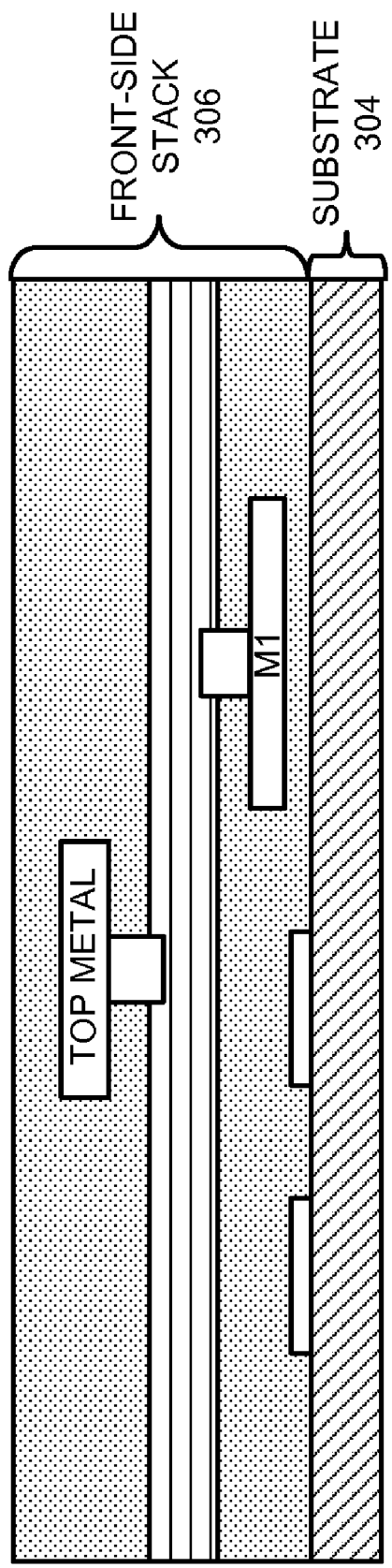
FIG. 3D illustrates transforming the TSV die of FIG. 3A into a front-side model and a back-side model in accordance with an embodiment of the present invention.
Figure 3D:
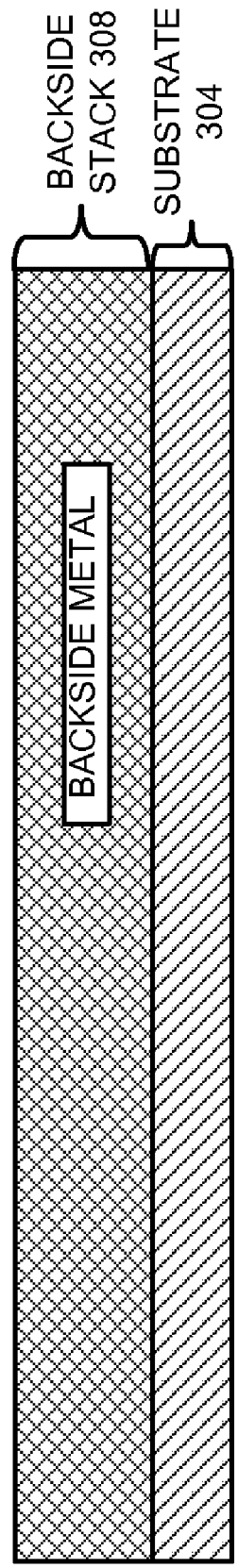

In some embodiments, a non-projection-based TSV-die transform can be used to transform a TSV die into extraction units. Referring to FIG. 3A, note that front-side stack 306 and back-side stack 308 are substantially shielded from each other because substrate 304 in between provides shielding effects on the two sides of the substrate. Hence, it is possible to directly decompose TSV die 202 into a front-side model and a back-side model. As illustrated in FIG. 3D, front-side model 320 includes substrate 304 and front-side stack 306, and back-side model 322 includes the same substrate 304 and back-side stack 308. Furthermore, both the top side and bottom side of substrate 304 can be set as electric reference ground potential.

While both models 320 and 322 ignore TSV 302, it is possible to model TSV 302 separately from the front and back layer stacks. Consequently, TSV die 202 in FIG. 3A is transformed into two 2D-IC extraction units in FIG. 3D and a separate TSV model which models the RLC parasitic caused by TSV 302.

In some embodiments, the front-side model 320, the back-side model 322 and the TSV model can be combined into a composite RLC model library for TSV die 202, which is subsequently used during RLC extractions of the TSV die 202.

Die-to-Die Transform

Figure 4A:
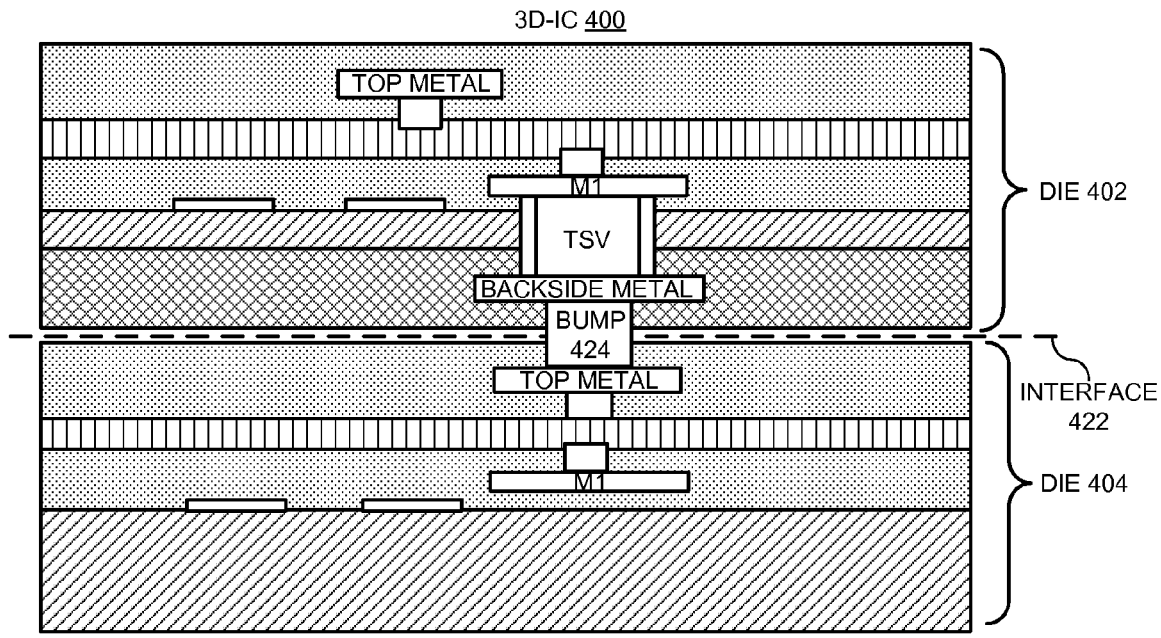
FIG. 4A illustrates transforming the two-die stack into individual extraction units by direct partitioning at the bonding interface in accordance with an embodiment of the present invention.
Figure 4B:
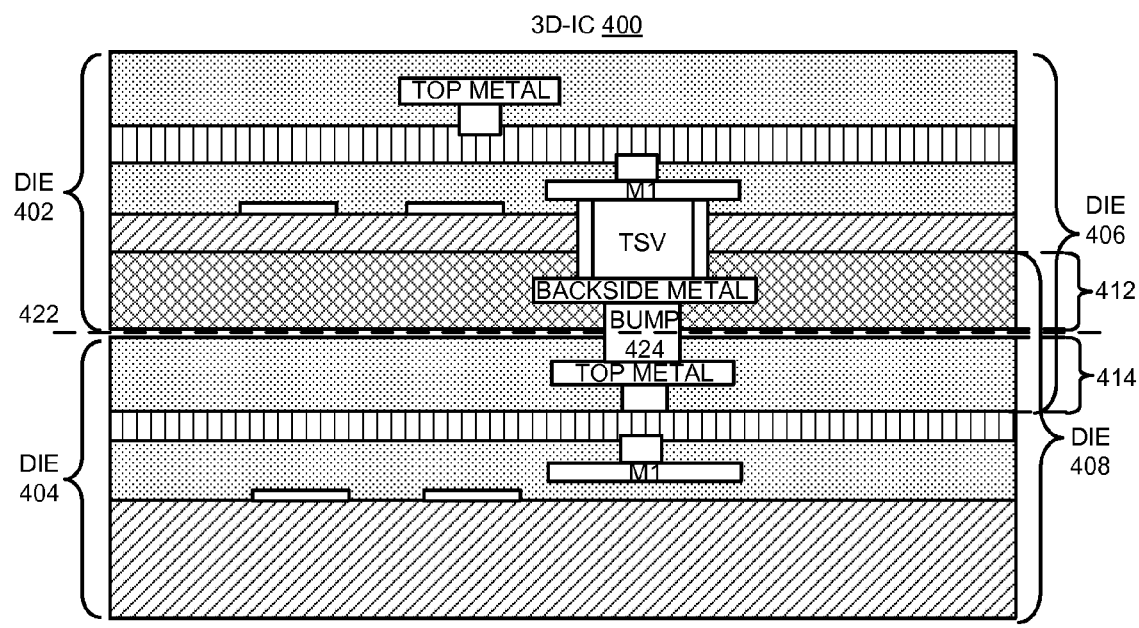
FIG. 4B illustrates transforming the two-die stack into individual extraction units by including additional metal layers from the opposite side of the transform boundary in accordance with an embodiment of the present invention.

FIGS. 4A and 4B illustrate a process for transforming 3D-IC stack 400 (same as 3D-IC die 200 in FIG. 2) into individual extraction units in accordance with an embodiment of the present invention. As described above, two-die stack 400 comprises an upper die 402 and a lower die 404, which are electrically and mechanically coupled through micro bump 424 across bonding interface 422.

More specifically, FIG. 4A illustrates transforming two-die stack 400 into individual extraction units by direct partitioning at the bonding interface in accordance with an embodiment of the present invention.

The transform process typically starts by identifying a transform boundary between upper die 402 and lower die 404. In one embodiment, the transform boundary is the stacking interface 422 between the two dies. The transform process then separates upper die 402 and lower die 404 at the transform boundary 422 to create two single dies 402 and 404. Note that die 404 has a single-sided substrate structure, and thus can be considered a single extraction unit. Die 402 is a TSV die which has a double-sided substrate structure. Hence, die 402 can be further transformed using the above-described TSV die transform technique.

Embodiments of FIG. 4A partition two-die stack 400 at bonding interface 422 but ignore the RLC coupling (e.g., the "inter-die" coupling) between die 402 and die 404. This inter-die coupling can occur between metal layers proximate to and on the opposite sides of the transform boundary 422. FIG. 4B illustrates transforming two-die stack 400 into individual extraction units by including additional metal layers from the opposite side of the transform boundary in accordance with an embodiment of the present invention.

In this embodiment, the top few metal layers from die 404 are included in the process description file of upper die 402 to form a transformed upper die 406, and the bottom few metal layers from die 402 are included in the process description file of lower die 404 to form a transformed lower die 408. As illustrated in FIG. 4B, die 408 includes original lower die 404 and the back-side stack 412 in original upper die 402, wherein back-side stack 412 becomes the top metal layers in transformed die 408. Separately, transformed die 406 includes original upper die 402 and the topmost metal layers 414 in original upper die 404, wherein topmost metal layers 414 become part of the back-side stack for transformed upper die 406. In some embodiments, a transformed die 406 or 408 only needs to include the first one or two metal layers which are adjacent to and on the opposite side of interface 422. This is because the LC coupling between metal layers on opposite sides of interface 422 decreases with physical separations. Typically, a transformed die 406 or 408 includes at least the first metal layer which is adjacent to and on the opposite side of interface 422.

In the embodiment of FIG. 4B, the die-to-die interconnects, such as bump 424, are included in the process description files for both the transformed dies 406 and 408. Thus, separate RLC models need to be generated for these structures. For 3D-ICs using bump bonding, the inclusion of the micro bumps in the RLC models ensures that inter-die RLC couplings can be extracted.

Note that transformed die 408 has a single-sided substrate structure and, thus, can be considered a single extraction unit. Transformed die 406 is a TSV-die which has a double-sided substrate structure. Hence, die 406 can be further transformed using the above-described TSV die transform technique.

Eventually, 3D-IC 400 can be decomposed into multiple 2D-IC extraction units. For each of these 2D-IC extraction units, an RLC model library can be built for that extraction unit if the model library does not already exist. Note that during subsequent extraction of the set of RLC model libraries, whether or not a layer in the extraction unit is included from an adjacent die is irrelevant to the extraction tool.

Note that the aforementioned transform techniques are not limited to the particular die-stacking configuration of 3D-IC stack 400. Generally, they are applicable to face-to-face, face-to-back, back-to-back, and silicon-interposer-based die stacking as well as other possible die-stacking configurations. Furthermore, the transform techniques are applicable to different wafer-bonding techniques, including but not limited to, bump bonding, direct fusion bonding, polymer adhesive bonding, and eutectic bonding. Hence, the present invention is not limited to the specific implementation of 3D-IC stack 400 as illustrated in FIGS. 4A and 4B.

Multi-Die Stack Transform

Note that the two-die stack transform described above can be extended to multi-die stacks with two or more stacking boundaries.

Figure 5A:
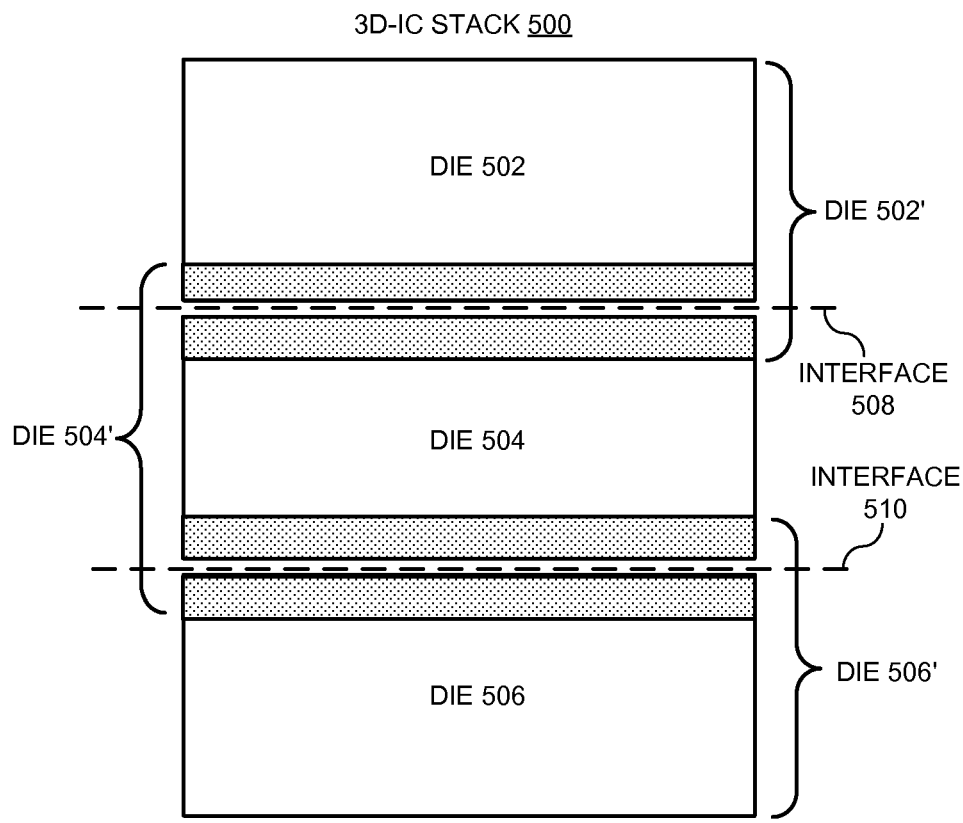
FIG. 5A illustrates transforming a three-die stack into individual extraction units in accordance with an embodiment of the present invention.

FIG. 5A illustrates transforming a three-die stack 500 into individual extraction units in accordance with an embodiment of the present invention.

As illustrated in FIG. 5A, 3D-IC stack 500 includes an upper die 502, which is stacked on top of a middle die 504, which is stacked on top of a lower die 506. During a transform process, die-to-die interface 508 between die 502 and die 504 becomes the first transform boundary, and die-to-die interface 510 between die 504 and die 506 becomes the second transform boundary. It is assumed that each die in 3D-IC stack 500 only interacts with an adjacent die when considering LC coupling between dies. Hence, transformed upper die 502' includes one or more metal layers adjacent to interface 508 from middle die 504; transformed middle die 504' includes one or more metal layers adjacent to interface 508 from upper die 502, and also one or more metal layers adjacent to interface 510 from lower die 506; and transformed lower die 506' includes one or more metal layers adjacent to interface 510 from middle die 504. As shown in FIG. 5A, 3D-IC stack 500 is transformed into three dies 502', 504' and 506' for extraction modeling. At this point, each transformed die may be further transformed if it is still not extractable using 2D-IC extraction tools. For example, if a transformed die is a TSV die, a TSV die transform can be applied to transform the TSV die into 2D-IC extraction units.

For a 3D-IC die stack comprising even more dies, the following general procedure may be used to perform the initial decomposition into multiple dies. If the back-side of a die is interfaced with another die, the back-side metal layers may include one or more metal layers from the adjacent die underneath the die for modeling and extractions. If the front-side of a die is interfaced with another die, the front side metal layers may include one or more metal layers from the adjacent die on top of the die for modeling and extractions. If both the front-side and back-side of a die are interfaced with two other dies, then the front-side metal layers will include the metal layers from the other die that is coupled to the front-side. The back-side metal layers will include the metal layers from the other die that is coupled to the back-side.

RLC Extraction Based on Extraction Units

Flat Transform Invariant Extraction

The above-described transform techniques create a set of extraction units for a given 3D-IC design, and each extraction unit may be RLC extracted using a 2D-IC extraction tool. In some embodiments, during extraction, if an extraction unit includes metal layers from an adjacent die, the design database for the adjacent die is also included, so that the inter-die RLC coupling between adjacent two dies in the original 3D-IC design can be fully extracted and included in the parasitic of the extraction unit. This way, the extraction process generates RLC parasitic netlist files which include inter-die RLC data for each extraction unit.

Figure 5B:
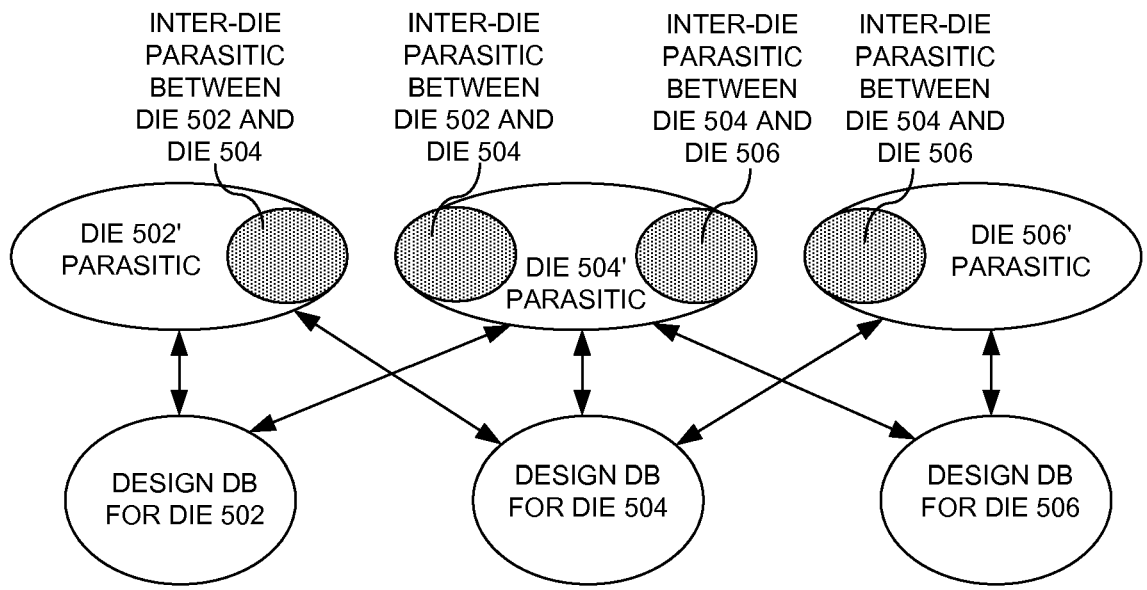
FIG. 5B illustrates an extraction model for performing RLC extractions on the transformed dies in FIG. 5A in accordance with an embodiment of the present invention.

FIG. 5B illustrates an extraction model for performing RLC extractions on the transformed dies in FIG. 5A in accordance with an embodiment of the present invention. As illustrated in FIG. 5B, during an extraction process for transformed dies 502'-506', three design databases which correspond to original dies 502-506 are used. More specifically, extracted parasitic data for transformed die 502' comprises parasitic data for die 502, which is extracted using design database for die 502, and inter-die parasitic coupling between die 502 and 504, which is extracted using both design databases for die 502 and die 504. Extracted parasitic data for transformed die 506' comprises parasitic data for die 506, which is extracted using design database for die 506, and inter-die parasitic coupling between die 504 and 506, which is extracted using both design databases for die 504 and die 506. Extracted parasitic data for transformed die 504' comprises parasitic data for die 504, which is extracted using design database for dies 504. Parasitic data for die 504' also includes inter-die parasitic coupling between die 502 and 504, which is extracted using both design databases for die 502 and die 504. Additionally, parasitic data for die 504' include inter-die parasitic coupling between die 504 and 506, which is extracted using both design databases for die 504 and 506.

Hierarchical Transform Invariant Extraction

By using the above-described transforms and transform-invariant techniques for modeling and extractions, each extraction unit can generate a separate parasitic RLC netlist file.

For inter-die RLC couplings, the parasitic values can be represented in form of an inter-die parasitic library file. When extractions are completed, simulation and analysis tools can be used to perform hierarchical simulations and analyses using the aforementioned parasitic RLC netlist files and the inter-die parasitic library files. In some embodiments, these inter-die parasitic library files can be pre-characterized based on process technologies and layout design rules. The pre-characterization can be done either by interconnect RLC parasitic extraction tools or other CAD tools. Each of the parasitic RLC netlist files and the inter-die parasitic library files can contain the following parasitic values: resistance; resistance and capacitance; resistance, capacitance and inductance; resistance and inductance.

Note that a hierarchical simulation and analysis on 3D-IC designs do not require the availability of a complete set of extracted RLC parasitic netlist files for a 3D-IC design. Instead, a hierarchical simulation and analysis can be performed only on those currently available RLC parasitic netlist files.

Process for Performing an RLC Extraction for a 3D-IC Design

For each extraction unit, the extracted parasitic netlist data can be stored in an internal extraction database that preserves all the necessary info related to each parasitic node of a net. After completion of extracting all the extraction units, the parasitic data in these databases are combined into a single parasitic netlist output file with proper electric net and node connectivity as well as correct parasitic values.

Figure 6:
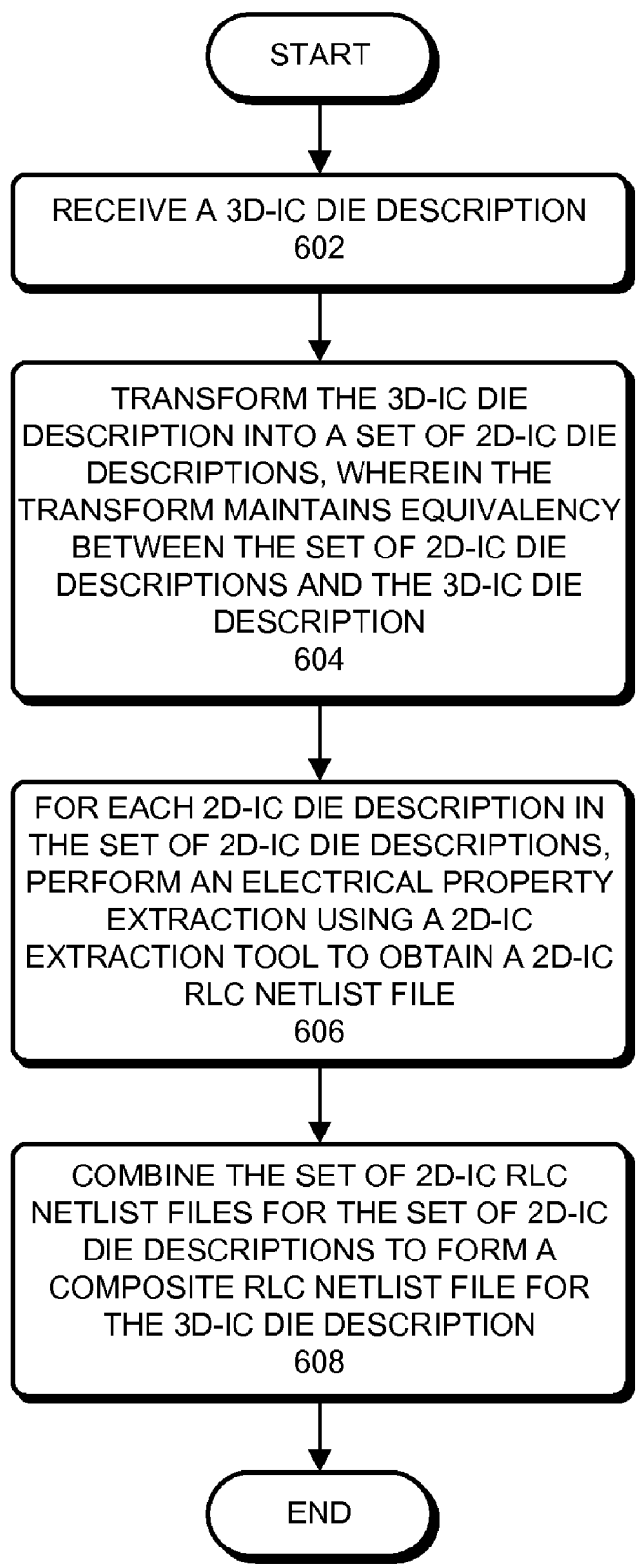
FIG. 6 presents a flowchart illustrating a process for performing an RLC extraction for a 3D-IC die in accordance with an embodiment of the present invention.

FIG. 6 presents a flowchart illustrating a process for performing an RLC extraction for a 3D-IC die in accordance with an embodiment of the present invention.

During operation, the system receives a 3D-IC die description (step 602). The system then transforms the 3D-IC die description into a set of 2D-IC die descriptions, wherein the transform maintains equivalency between the set of 2D-IC die descriptions and the 3D-IC die description (step 604). Note that this equivalency can include both electrical property equivalency and connectivity equivalency. Furthermore, the set of 2D-IC die descriptions include the effects of inter-die couplings within the 3D-IC die description. Next, for each 2D-IC die description in the set of 2D-IC die descriptions, the system performs an electrical property extraction using a 2D-IC extraction tool to obtain a 2D-IC RLC netlist file (step 606). Finally, the system combines the set of 2D-IC RLC netlist files for the set of 2D-IC die descriptions to form a composite RLC netlist file for the 3D-IC die description (step 608).

Figure 7:
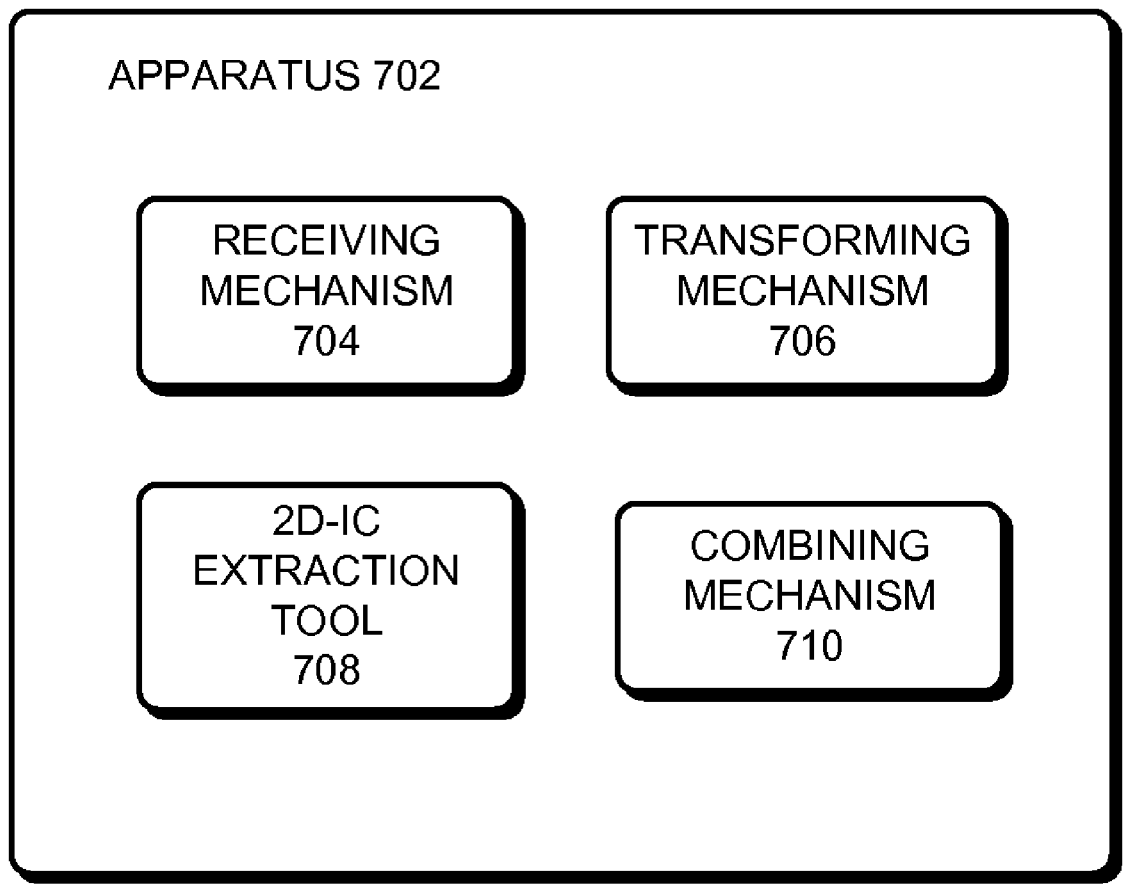
FIG. 7 illustrates an apparatus that performs an RLC extraction for a 3D-IC die in accordance with an embodiment of the present invention.

FIG. 7 illustrates an apparatus that performs an RLC extraction for a 3D-IC die in accordance with an embodiment of the present invention.

Apparatus 702 can comprise mechanisms which communicate with one another via a wire or wireless communication channel. Specifically, apparatus 702 can comprise a receiving mechanism 704, a transforming mechanism 706, a 2D-IC extraction tool 708, and a combining mechanism 710. A mechanism may be realized using one or more integrated circuits or as a module of a general purpose processor. Apparatus 702 can be part of a computer system.

In some embodiments, receiving mechanism 704 may be configured to receive a 3D-IC die description; transforming mechanism 706 may be configured to transform the 3D-IC die description into a set of 2D-IC die descriptions, wherein the transform maintains equivalency between the set of 2D-IC die descriptions and the 3D-IC die description; 2D-IC extraction tool 708 may be configured to perform an electrical property extraction for each 2D-IC die description in the set of 2D-IC die descriptions to obtain a 2D-IC RLC netlist file; and combining mechanism 710 may be configured to combine the set of 2D-IC RLC netlist files for the set of 2D-IC die descriptions to form an RLC netlist file for the 3D-IC die description.

Silicon-Interposer-Based 3D-IC Modules

Figure 8A:
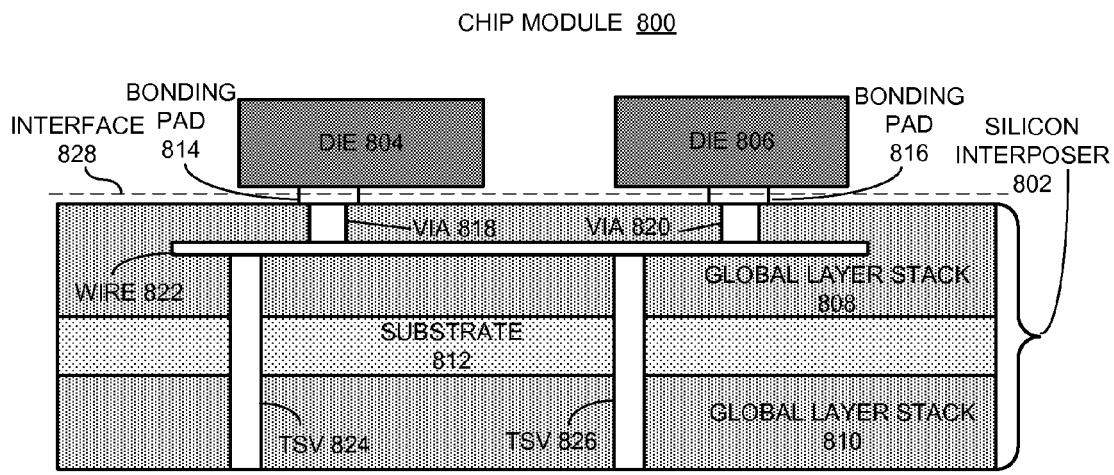
FIG. 8A illustrates a silicon-interposer-based chip module comprising a silicon interposer and two IC dies in accordance with an embodiment of the present invention.

A silicon interposer provides an electrical interface and an integration platform for integrating multiple IC dies into a single chip module or package. FIG. 8A illustrates a silicon-interposer-based chip module 800 comprising a silicon interposer 802 and two IC dies 804 and 806 in accordance with an embodiment of the present invention.

As illustrated in FIG. 8A, silicon interposer 802 has a double-sided substrate structure, which further comprises a top global layer stack 808, a bottom global layer stack 810, and a substrate 812 disposed between the top and bottom global layer stacks. Both global layer stacks 808 and 810 typically include multiple metal layers which can be used to distribute signals and interconnect multiple IC dies mounted on the surface of silicon interposer 802. In some embodiments, each of the global layer stacks can also include one or more active layers. Moreover, dies 804 and 806 are horizontally integrated on the top global layer stack 808 of silicon interposer 802. These two dies are electrically coupled through bonding pads 814 and 816 between the dies and silicon interposer 802, vias 818 and 820 in top global layer stack 808, and wire 822 in top global layer stack 808. In some embodiments, bottom global layer stack 810 can be used to interface with a package.

Note that the top and bottom global layer stacks are electrically coupled through two TSVs 824 and 826. Note that with these TSVs, signals from a package can be distributed to die 804 and die 806 on the front side of silicon interposer 802. Hence, silicon interposer 802 is essentially a TSV die with a double-sided substrate structure. Moreover, each die (die 804 or die 806) and silicon interposer 802 form a 3D-IC die-stack. Consequently, the entire chip module 800 is a 3D-IC module which can be extracted using the 3D-IC RLC extraction techniques described above. For example, chip module 800 can be decomposed to separate die 804 and die 806 from silicon interposer 802 near bonding interface 828 by using the above-described die-to-die transform. Next, silicon interposer 802 with TSVs can be further decomposed input extraction units by using the above-described TSV transform. All decomposed extraction units of chip module 800 are then individually extracted using 2D-IC extraction tools and the individual RLC parasitic netlist files can be combined to generate a composite RLC parasitic netlist file for silicon-interposer-based chip module 800.

Figure 8B:
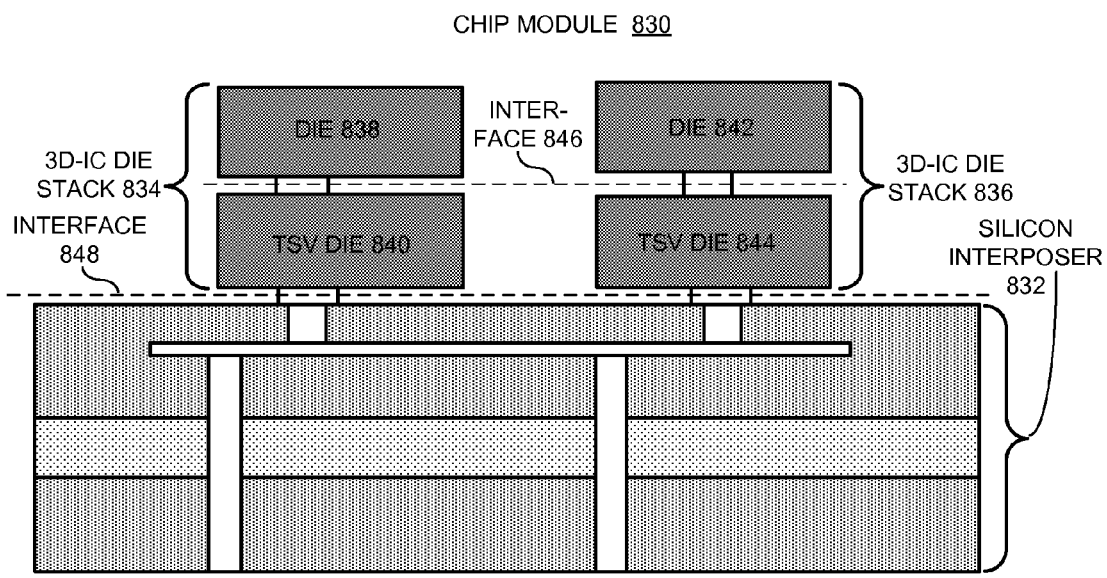
FIG. 8B illustrates a silicon-interposer-based chip module comprising a silicon interposer and two 3D-IC die stacks in accordance with an embodiment of the present invention.

FIG. 8B illustrates a silicon-interposer-based chip module 830 comprising a silicon interposer 832 and two 3D-IC die stacks 834 and 836 in accordance with an embodiment of the present invention.

As illustrated in FIG. 8B, silicon interposer 832 also has a double-sided substrate structure. 3D-IC die stacks 834 and 836 are integrated with silicon interposer 832 in the same manner as dies 804 and 806 integrated with silicon interposer 802. However, 3D-IC die stack 834 further comprises a top die 838 and a bottom TSV die 840, which are vertically integrated through bonding; and 3D-IC die stack 836 further comprises a top die 842 and a bottom TSV die 844, which are vertically integrated through bonding. Consequently, the entire chip module 830 is a 3D-IC module which can be extracted using the 3D-IC RLC extraction techniques described above.

For example, chip module 830 can be decomposed using the above-described multi-die transform process near bonding interfaces 846 and 848 which separates silicon interposer 832 with TSVs, die 838, die 842, TSV die 840, and TSV die 844. Next, each TSV die is further decomposed using the above-described TSV transform. All decomposed extraction units of chip module 830 are then individually extracted using 2D-IC extraction tools and the individual RLC parasitic netlist files can be combined to generate a composite RLC parasitic netlist file for silicon-interposer-based chip module 830.

Note that although we describe extracting silicon-interposer-based 3D-IC modules in the context of chip modules 800 and 830 as illustrated in FIGS. 8A and 8B, the present invention can generally be applied to any type of silicon-interposer-based 3D-IC modules. Hence, the present invention is not limited to the specific configurations of the silicon-interposer-based 3D-IC modules as illustrated in FIGS. 8A and 8B.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for performing an RLC extraction for a three-dimensional integrated circuit (3D-IC) die, the method comprising:
receiving a 3D-IC die description which describes the 3D-IC die, wherein the 3D-IC die comprises two or more vertically stacked 2D-IC dies which are coupled through at least one through-silicon via (TSV);
transforming the 3D-IC die description into a set of 2D-IC die descriptions, wherein the transform maintains equivalency between the set of 2D-IC die descriptions and the 3D-IC die description and wherein the set of 2D-IC die descriptions includes a modified TSV;
for each 2D-IC die description in the set of 2D-IC die descriptions, performing, by computer, an electrical property extraction using a 2D-IC extraction tool to obtain a 2D-IC RLC netlist file; and
combining the set of 2D-IC RLC netlist files for the set of 2D-IC die descriptions to form an RLC netlist file for the 3D-IC die description.

2. The method of claim 1, wherein the 3D-IC die description comprises a through-silicon via (TSV) die, wherein the TSV die further includes:
a front-side layer stack which includes a top metal layer;
a back-side layer stack which includes at least one back-side metal layer;
a double-sided substrate which is disposed between the front-side layer stack and the back-side layer stack; and
a TSV which passes through the double-sided substrate, and which electrically couples the front-side layer stack with the back-side layer stack.

3. The method of claim 2, wherein transforming the 3D-IC die description into a set of 2D-IC die descriptions involves transforming the TSV die into one or more 2D-IC die descriptions.

4. The method of claim 3, wherein transforming the TSV die into one or more 2D-IC die descriptions involves:
projecting the back-side layer stack onto the top of the front-side layer stack of the TSV die to create a virtual front-side layer stack, thereby removing the back-side layer stack, thereby transforming the double-sided substrate into a single-sided substrate; and
coupling the TSV to the virtual front-side layer stack while decoupling the TSV from the single-sided substrate, thereby transforming the TSV die into a 2D-IC die description.

5. The method of claim 3, wherein transforming the TSV die into one or more 2D-IC die descriptions further involves maintaining equivalency between the TSV die and the 2D-IC die description by creating a virtual substrate shield layer which is a conductor layer disposed between the virtual front-side layer stack and the top metal layer of the front-side layer stack, wherein the TSV passes through the virtual substrate shield layer.

6. The method of claim 5, wherein the virtual substrate shield layer is invisible to the front-side layer stack.

7. The method of claim 1, wherein the 3D-IC die description comprises a die stack, wherein the die stack further includes:
a first die;
a second die adjacent to the first die; and
a TSV interconnecting the first die and the second die.

8. The method of claim 7, wherein transforming the 3D-IC die description into the set of 2D-IC die descriptions involves transforming the die stack into at least two separate dies.

9. The method of claim 8, wherein transforming the die stack into at least two separate dies involves:
identifying a transform boundary between the first die and the second die; and
separating the first die from the second die to create a first transformed die and a second transformed die, respectively, wherein the first transformed die includes the first die
and at least one metal layer adjacent to the transform
boundary in the second die;
wherein the second transformed die includes the second
die and at least one metal layer adjacent to the transform boundary in the first die;
and
wherein including at least one metal layer from an adjacent die facilitates maintaining equivalency between
the two transformed dies and the die stack.

10. The method of claim 9, wherein the transform boundary can be:
an interface between a top metal layer in the first die and a
top metal layer in the second die in a face-to-face configuration of the 3D-IC die description;
an interface between a back-side metal layer in the first die
and a top metal layer in the second die in a face-to-back
configuration of the 3D-IC die description; or
an interface between a back-side metal layer in the first die
and a back-side metal layer in the second die in a back-to-back configuration of the 3D-IC die description.

11. The method of claim 9, wherein the first die is a TSV die.

12. The method of claim 9, wherein the method further comprises transforming each of the transformed dies into one or more 2D-IC die descriptions.

13. The method of claim 1, wherein the equivalency between the set of 2D-IC die descriptions and the 3D-IC die description can include:
an electrical property equivalency; and
a connectivity equivalency.

14. The method of claim 1, wherein the TSV die includes a silicon-interposer die.

15. A non-transitory computer-readable storage medium storing instructions that when executed by a computer cause the computer to perform a method for performing an RLC extraction for a three-dimensional integrated circuit (3D-IC) die, the method comprising:
receiving a 3D-IC die description which describes the 3D-IC die, wherein the 3D-IC die comprises two or more vertically stacked 2D-IC dies which are coupled through at least one through-silicon via (TSV);
transforming the 3D-IC die description into a set of 2D-IC die descriptions, wherein the transform maintains equivalency between the set of 2D-IC die descriptions and the 3D-IC die description and wherein the set of 2D-IC die descriptions includes a modified TSV;
for each 2D-IC die description in the set of 2D-IC die descriptions, performing an electrical property extraction using a 2D-IC extraction tool to obtain a 2D-IC RLC netlist file; and
combining the set of 2D-IC RLC netlist files for the set of 2D-IC die descriptions to form an RLC netlist file for the 3D-IC die description.

16. The non-transitory computer-readable storage medium of claim 15, wherein the 3D-IC die description comprises a through-silicon via (TSV) die, wherein the TSV die further includes:
a front-side layer stack which includes a top metal layer;
a back-side layer stack which includes at least one back-side metal layer;
a double-sided substrate which is disposed between the front-side layer stack and the back-side layer stack; and
a TSV which passes through the double-sided substrate, and which electrically couples the front-side layer stack with the back-side layer stack.

17. The non-transitory computer-readable storage medium of claim 16, wherein transforming the 3D-IC die description into a set of 2D-IC die descriptions involves transforming the TSV die into one or more 2D-IC die descriptions.

18. The non-transitory computer-readable storage medium of claim 17, wherein transforming the TSV die into one or more 2D-IC die descriptions involves:
projecting the back-side layer stack onto the top of the front-side layer stack of the TSV die to create a virtual front-side layer stack, thereby removing the back-side layer stack, thereby transforming the double-sided substrate into a single-sided substrate; and
coupling the TSV to the virtual front-side layer stack while decoupling the TSV from the single-sided substrate, thereby transforming the TSV die into a 2D-IC die description.

19. The non-transitory computer-readable storage medium of claim 17, wherein transforming the TSV die into one or more 2D-IC die descriptions further involves maintaining equivalency between the TSV die and the 2D-IC die description by creating a virtual substrate shield layer which is a conductor layer disposed between the virtual front-side layer stack and the top metal layer of the front-side layer stack, wherein the TSV passes through the virtual substrate shield layer.

20. The non-transitory computer-readable storage medium of claim 19, wherein the virtual substrate shield layer is invisible to the front-side layer stack.

21. The non-transitory computer-readable storage medium of claim 15, wherein the 3D-IC die description comprises a die stack, wherein the die stack further includes:
a first die;
a second die adjacent to the first die; and
a TSV interconnecting the first die and the second die.

22. The non-transitory computer-readable storage medium of claim 21, wherein transforming the 3D-IC die description into the set of 2D-IC die descriptions involves transforming the die stack into at least two separate dies.

23. The non-transitory computer-readable storage medium of claim 22, wherein transforming the die stack into at least two separate dies involves:
identifying a transform boundary between the first die and the second die; and
separating the first die from the second die to create a first transformed die and a second transformed die, respectively,
wherein the first transformed die includes the first die and at least one metal layer adjacent to the transform boundary in the second die;
wherein the second transformed die includes the second die and at least one metal layer adjacent to the transform boundary in the first die;
and
wherein including at least one metal layer from an adjacent die facilitates maintaining equivalency between the two transformed dies and the die stack.

24. The non-transitory computer-readable storage medium of claim 23, wherein the transform boundary can be:
an interface between a top metal layer in the first die and a top metal layer in the second die in a face-to-face configuration of the 3D-IC die description;
an interface between a back-side metal layer in the first die and a top metal layer in the second die in a face-to-back configuration of the 3D-IC die description; or
an interface between a back-side metal layer in the first die and a back-side metal layer in the second die in a back-to-back configuration of the 3D-IC die description.

25. The non-transitory computer-readable storage medium of claim 23, wherein the first die is a TSV die.

26. The non-transitory computer-readable storage medium of claim 23, wherein the method further comprises transforming each of the transformed dies into one or more 2D-IC die descriptions.

27. The non-transitory computer-readable storage medium of claim 15, wherein the equivalency between the set of 2D-IC die descriptions and the 3D-IC die description can include:
- an electrical property equivalency; and
- a connectivity equivalency.

28. The non-transitory computer-readable storage medium of claim 16, wherein the TSV die includes a silicon-interposer die.

29. An apparatus that performs an RLC extraction for a three-dimensional integrated circuit (3D-IC) die, comprising:
- a processor;
- a memory;
- a receiving mechanism configured to receive a 3D-IC die description which describes the 3D-IC die, wherein the 3D-IC die comprises two or more vertically stacked 2D-IC dies which are coupled through at least one through-silicon via (TSV);
- a transforming mechanism configured to transform the 3D-IC die description into a set of 2D-IC die descriptions, wherein the transform maintains equivalency between the set of 2D-IC die descriptions and the 3D-IC die description and wherein the set of 2D-IC die descriptions includes a modified TSV;
- a 2D-IC extraction tool configured to perform an electrical property extraction for each 2D-IC die description in the set of 2D-IC die descriptions to obtain a 2D-IC RLC netlist file; and
- a combining mechanism configured to combine the set of 2D-IC RLC netlist files for the set of 2D-IC die descriptions to form an RLC netlist file for the 3D-IC die description.

* * * * *